(12) United States Patent
Tu et al.

(10) Patent No.: US 11,056,488 B2
(45) Date of Patent: Jul. 6, 2021

(54) METAL-OXIDE-SEMICONDUCTOR DEVICE

(71) Applicant: Force MOS Technology Co., Ltd., New Taipei (TW)

(72) Inventors: Kao-Way Tu, New Taipei (TW); Yuan-Shun Chang, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 0 days.

(21) Appl. No.: 16/600,738

(22) Filed: Oct. 14, 2019

(65) Prior Publication Data
US 2020/0251468 A1 Aug. 6, 2020

(30) Foreign Application Priority Data
Feb. 1, 2019 (TW) .................. 108104238

(51) Int. Cl.
*H01L 27/088* (2006.01)
*H01L 23/535* (2006.01)
*H01L 29/417* (2006.01)
*H01L 29/423* (2006.01)

(52) U.S. Cl.
CPC .......... *H01L 27/088* (2013.01); *H01L 23/535* (2013.01); *H01L 29/41725* (2013.01); *H01L 29/42372* (2013.01)

(58) Field of Classification Search
CPC ............... H01L 23/4824; H01L 27/088; H01L 27/11273; H01L 29/0843; H01L 29/0873; H01L 29/41725; H01L 29/41766; H01L 29/42372; H01L 29/78
See application file for complete search history.

(56) References Cited

U.S. PATENT DOCUMENTS

| 2008/0054300 A1* | 3/2008 | Nikkel .............. H01L 29/41766 257/192 |
| 2013/0193494 A1* | 8/2013 | Vinet ................ H01L 29/78648 257/288 |
| 2019/0058042 A1* | 2/2019 | Then .................... H01L 29/2003 |
| 2020/0127116 A1* | 4/2020 | Chen ..................... H01L 29/778 |

* cited by examiner

*Primary Examiner* — David C Spalla
(74) *Attorney, Agent, or Firm* — Alan D. Kamrath; Karin L. Williams; Mayer & Williams PC

(57) ABSTRACT

A metal-oxide-semiconductor (MOS) device comprising a heavily doped substrate, an epitaxial layer, an open, a plurality of MOS units, and a metal pattern layer is provided. The epitaxial layer is formed on the heavily doped substrate. The open is defined in the epitaxial layer to expose the heavily doped substrate. The MOS units are formed on the epitaxial layer. The metal pattern layer comprises a source metal pattern, a gate metal pattern, and a drain metal pattern. The source metal pattern and the gate metal pattern are formed on the epitaxial layer. The drain metal pattern fills in the open and is extended from the heavily doped substrate upward to above the epitaxial layer.

9 Claims, 8 Drawing Sheets

US 11,056,488 B2

METAL-OXIDE-SEMICONDUCTOR DEVICE

BACKGROUND OF INVENTION

1. Field of the Invention

The present invention is related to a metal-oxide-semiconductor (MOS) device, and more particularly is related to a chip-scale package MOS device.

2. Description of the Prior Art

As the portable electronic devices become smaller, the development of electronic components turns to the features of small size and high performance. Due to the intrinsic limitations of semiconductor materials and semiconductor processes, the cost of chip scaling becomes higher and higher, and thus, the novel packaging methods become the key of scaling in the semiconductor industry.

SUMMARY OF THE INVENTION

Accordingly, a metal-oxide-semiconductor device is provided to reduce the packaging size as well as the packaging cost.

A metal-oxide-semiconductor (MOS) device is provided. The MOS device comprises a heavily doped substrate, an epitaxial layer, an open, a plurality of MOS units, and a metal pattern layer. The epitaxial layer is formed on the heavily doped substrate. The open is defined in the epitaxial layer to expose the heavily doped substrate. The MOS units are formed on the epitaxial layer. The metal pattern layer comprises a source metal pattern, a gate metal pattern, and a drain metal pattern. The source metal pattern and the gate metal pattern are formed on the epitaxial layer. The drain metal pattern fills in the open and is extended from the heavily doped substrate upward to above the epitaxial layer.

In comparison to the conventional MOS device, the MOS device provided in the present invention is suitable to be applied to chip-scale packaging and thus is helpful for reducing packaging size as well as packaging cost.

The present invention will now be specified with reference to its preferred embodiment illustrated in the drawings.

DESCRIPTION OF THE PREFERRED EMBODIMENT

Figure 1A:
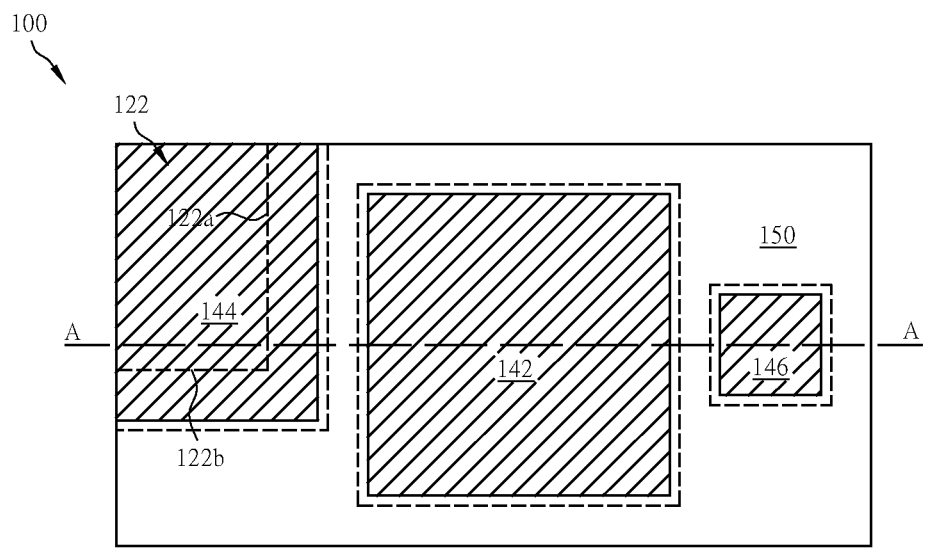
FIG. 1A is a top view of the MOS device in accordance with a first embodiment of the present invention.

The specific structural and functional details disclosed herein are only representative and are intended for describing exemplary embodiments of the disclosure. It is noted that, in the disclosure, similar elements would be represented by the same labels. Moreover, the drawings are for the purpose of illustration. The drawings may not be drawn based on precise proportions, and the drawing may not contain all the details.

FIG. 1A is a top view of a MOS device in accordance with a first embodiment of the present invention. FIG. 19 is a cross-sectional view of the MOS device in FIG. 1A along line A-A.

As shown, the MOS device 100 comprises a heavily doped substrate 110, an epitaxial layer 120, an open 122, a plurality of MOS units (not shown), a metal pattern layer and a spacing layer 150. The epitaxial layer 120 is formed on the heavily doped substrate 110. In the present embodiment, the heavily doped substrate 110 is a heavily-doped N-type substrate, the epitaxial layer 120 is an N-type epitaxial layer. And the heavily doped substrate 110 acts as a drain of the MOS device 100.

The open 122 is defined in the epitaxial layer 120 to expose the heavily doped substrate 110. The MOS units are formed in the epitaxial layer 120, and more specifically, are located in the active region of the MOS device. In accordance with an embodiment of the present invention, the MOS unit is a trenched MOS unit with a trenched gate and a doped source region surrounding the trenched gate. However, the present invention is not limited thereto. In another embodiment of the present invention, the MOS unit can be a planar MOS unit.

The metal pattern layer includes a source metal pattern 142, a gate metal pattern 146, and a drain metal pattern 144. The source metal pattern 142 and the gate metal pattern 146 are located on the epitaxial layer 120, but the drain metal pattern 144 is deposited in the open 122 and extended from an upper surface of the heavily doped substrate 110 upward over the epitaxial layer 120.

As shown in FIG. 1A, in the present embodiment, the open 122 is located at the corner of the epitaxial layer 120 and is defined in the epitaxial layer 120 by two etching walls 122a and 122b. The two etching walls 122a and 122b are perpendicular to each other so as to define a rectangular open 122. However, the present invention is noted thereto. In accordance with another embodiment of the present invention, the open 122 may be defined in the epitaxial layer 120 by three or more etching walls, such as the structure shown in FIG. 3. In addition, the etching walls may not be perpendicular to each other. The included angle between the etching walls can be adjusted according to the need in practice, e.g. the need due to the arrangement change of MOS units.

The spacing layer 150 is formed on the epitaxial layer 120 and fills the gaps among the source metal pattern 142, the gate metal pattern 146, and the drain metal pattern 144 to isolate the source electrode S, the gate electrode G and the drain electrode D of the MOS device 100. The spacing layer 150 also has opens to define the position of the source contact pad, the gate contact pad, and the drain contact pad. In accordance with an embodiment of the present invention, the spacing layer 150 is a passivation layer.

In the present embodiment, the spacing layer 150 is used in the MOS device 100 to isolate the source metal pattern 142, the gate metal pattern 146, and the drain metal pattern 144 to guarantee normal operation of the MOS device. However, the present invention is not limited thereto. In accordance with another embodiment of the present invention, if the gaps among the source metal pattern 142, the gate metal pattern 146, and the drain metal pattern 144 are widen, the spacing layer 150 can be skipped.

In addition, as shown in FIG. 1A, the heavily doped substrate 110 is rectangular shaped to facilitate the arrangement of the source metal pattern 142, the gate metal pattern 146, and the drain metal pattern 144. In consideration of the preference of the position of the gate bus and the doped source region in the epitaxial layer, the metal patterns may be arranged in the epitaxial layer 120 along the long edge of the heavily doped substrate 110 in the order of the drain metal pattern 144, the source metal pattern 142 and the gate metal pattern 146, or the order of the drain metal pattern 144, the gate metal pattern 146 and the source metal pattern 142.

Figure 1B:
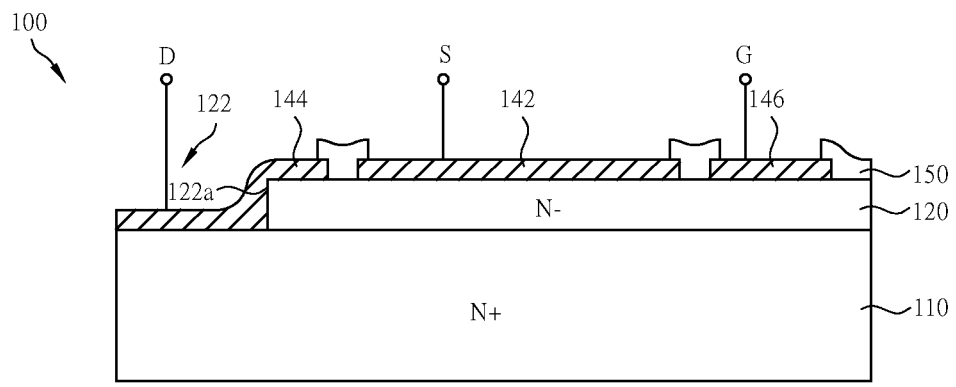
FIG. 1B is a cross-sectional view of the MOS device in FIG. 1A along line A-A.

FIGS. 2A to 2E are cross-sectional view showing the manufacturing method of the MOS device of FIGS. 1A and 1B in accordance with an embodiment of the present invention.

Figure 2A:
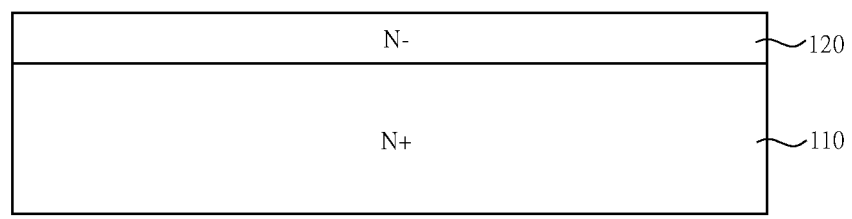
FIGS. 2A to 2E are schematic views showing the manufacturing method of the MOS device of FIGS. 1A and 1B in accordance with an embodiment of the present invention.

Firstly, as shown in FIG. 2A, a heavily doped substrate 110 is provided and an epitaxial layer 120 is formed on the heavily doped substrate 110.

Figure 2B:
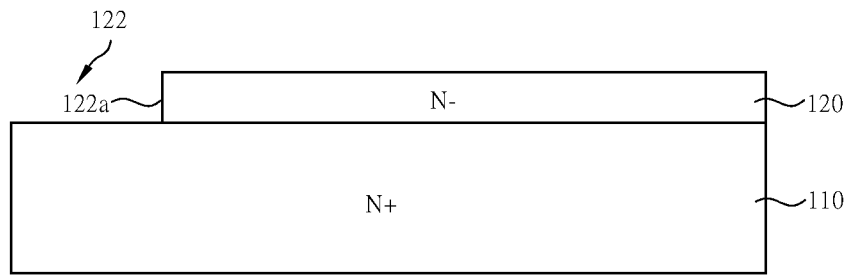

Then, as shown in FIG. 2B, a deep etching process is carried out to form an open 122 in the epitaxial layer 120 to expose the heavily doped substrate 110 under the open 122. Thereafter, a plurality of MOS units (not shown) are formed in the epitaxial layer 120.

Please also refer to FIG. 1A, in the present embodiment, the open 122 is located at the corner of the epitaxial layer 120 and is defined in the epitaxial layer 120 by two etching walls 122a and 122b. In accordance with an embodiment of the present invention, the two etching walls 122a and 122b are perpendicular to each other so as to define a rectangular shaped open 122 at the corner of the epitaxial layer 120.

Figure 2C:
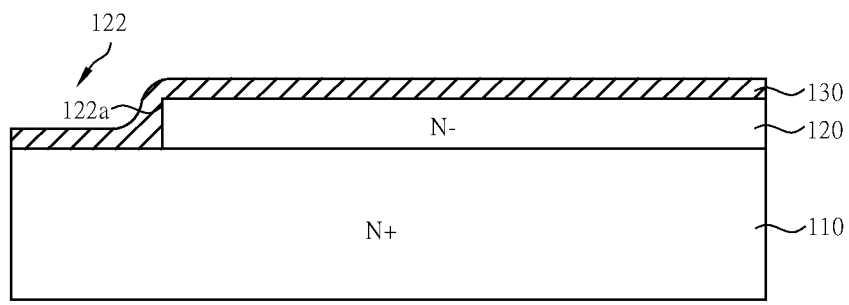

Thereafter, as shown in FIG. 2C, a metal layer 130 is formed to cover the epitaxial layer 120 and the exposed area of the heavily doped substrate 110. That is, the metal layer 130 is deposited in the open 122 of the epitaxial layer 120 and is extended from the upper surface of the heavily doped substrate 110 upward to cover the epitaxial layer 120.

Figure 2D:
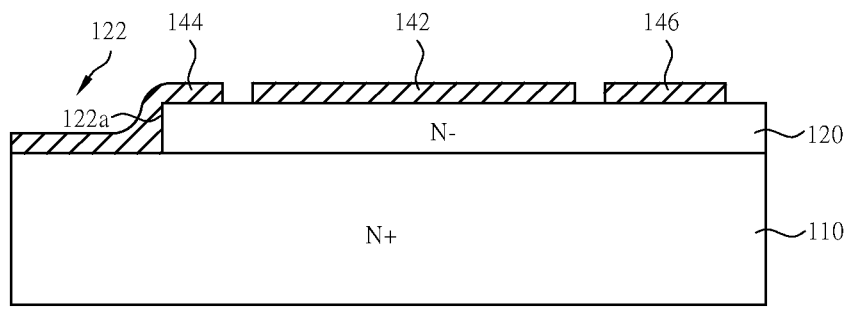

Afterward, as shown in FIG. 2D, a lithographic and etching process is applied to the metal layer 130 to form a metal pattern layer, which includes a source metal pattern 142, a gate metal pattern 146, and a drain metal pattern 144. The source metal pattern 142 and the gate metal pattern 146 are located on the epitaxial layer 120. The drain metal pattern 144 is deposited in the open 122 of the epitaxial layer 120 and is extended upward over the epitaxial layer 120. That is, the drain metal pattern 144 is extended from the bottom of the open 122 along the etching walls 122a and 122b upward to cover the upper surface of the epitaxial layer 120.

Figure 2E:
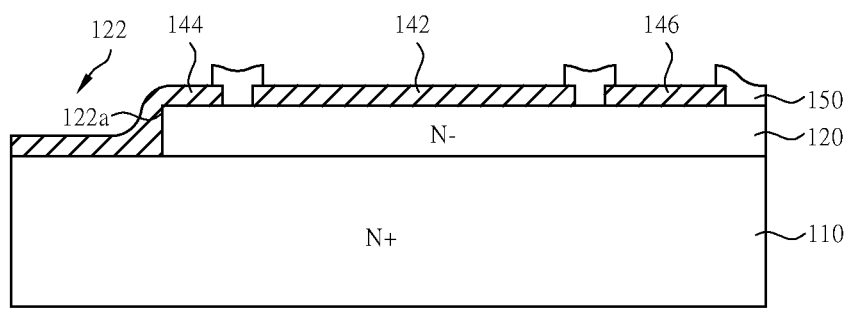

Then, as shown in FIG. 2E, a spacing layer 150 is formed on the epitaxial layer 120. The spacing layer 150 fills the gaps among the source metal pattern 142, the gate metal pattern 146, and the drain metal pattern 144 to isolate the source metal pattern 142, the gate metal pattern 146, and the drain metal pattern 144. The spacing layer 150 also has opens to define the position of the source contact pad, the drain contact pad and the gate contact pad.

By using the aforementioned manufacturing method, the MOS device 100 shown in FIGS. 1A and 1B can be formed.

In this embodiment, the open 122 is formed before the step of forming the MOS units in the epitaxial layer 120. However, the present invention is not limited thereto. In accordance with another embodiment of the present invention, the open 122 may be formed after the step of forming the MOS units in the epitaxial layer 120 and before the step of forming the metal layer 130.

Figure 3:
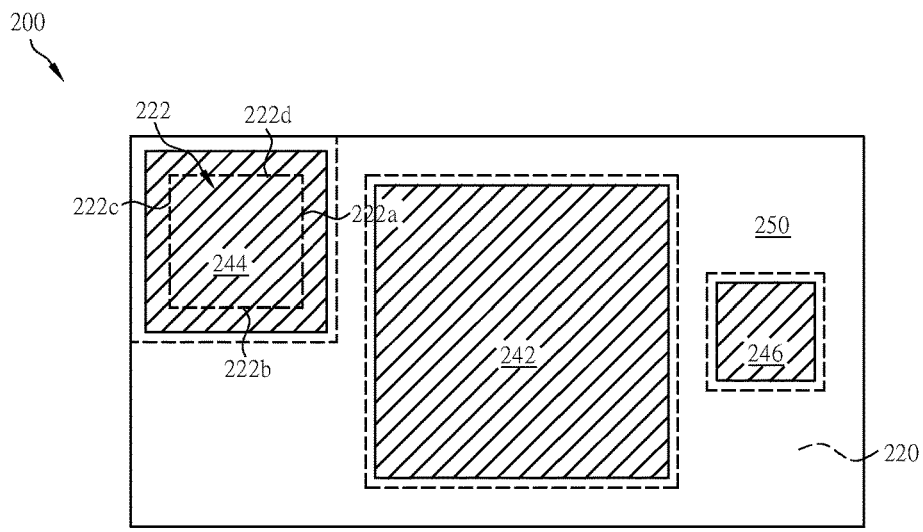
FIG. 3 is a top view of the MOS device in accordance with a second embodiment of the present invention.

FIG. 3 is a top view of the MOS device in accordance with a second embodiment of the present invention. As shown, the MOS device 200 of the present embodiment also has an open 222 defined in the epitaxial layer 220 to expose the heavily doped substrate therebelow. However, different from the embodiment shown in FIG. 1A, the open 222 of the present embodiment is defined by four etching walls 222a, 222b, 222c, and 222d in the epitaxial layer 220, and a predetermined distance is kept between the open 222 and the sidewall of the epitaxial layer 220.

Figure 4A:
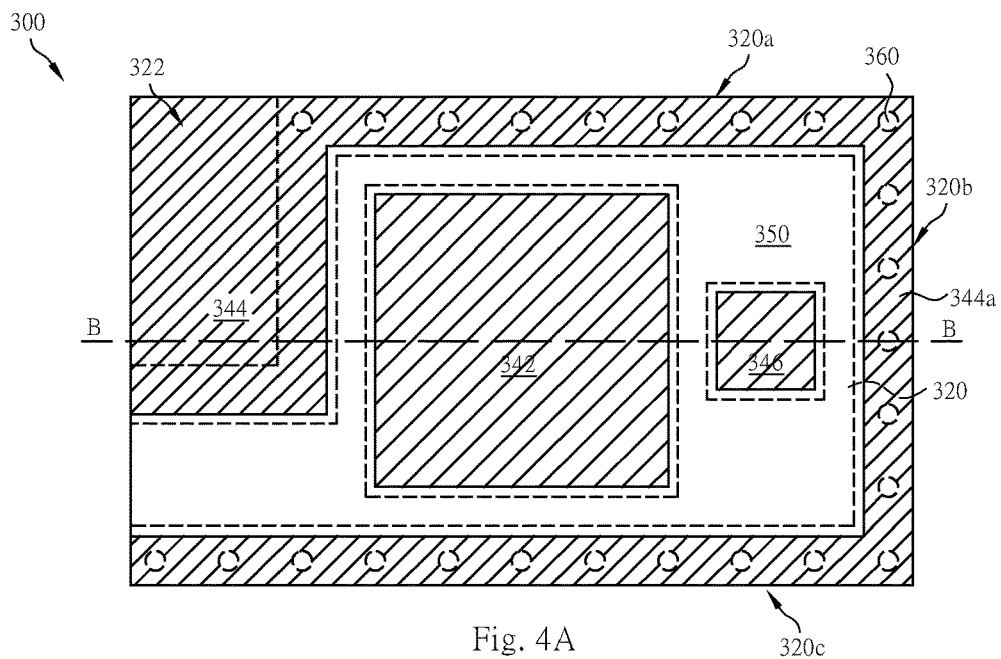
FIG. 4A is a top view of the MOS device in accordance with a third embodiment of the present invention.
Figure 4B:
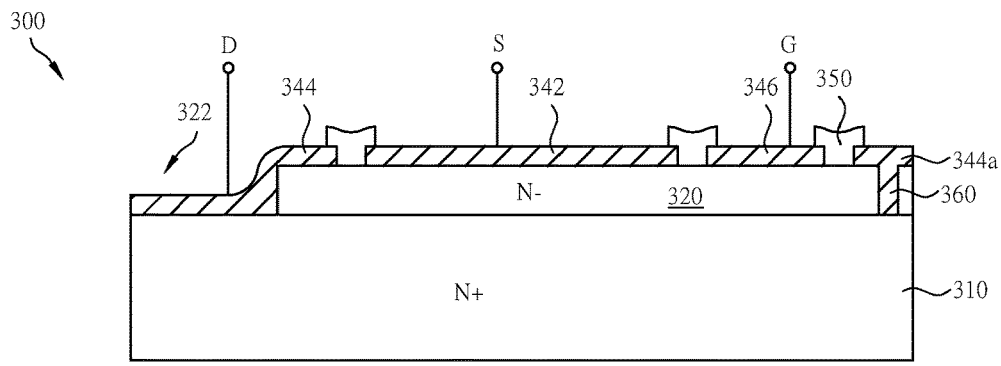
FIG. 4B is a cross-sectional view of the MOS device in FIG. 4A along line B-B.

FIG. 4A is a top view of the MOS device in accordance with a third embodiment of the present invention. FIG. 4B is a cross-sectional view of the MOS device in FIG. 4A along line B-B.

As shown, the MOS device 300 comprises a heavily doped substrate 310, an epitaxial layer 320, an open 322, a plurality of MOS units (not shown), a metal pattern layer and a spacing layer 350. The epitaxial layer 320 is formed on the heavily doped substrate 310. The open 322 is defined in the epitaxial layer 320 to expose the heavily doped substrate 310. The MOS units are formed in the epitaxial layer 320.

The metal pattern layer includes a source metal pattern 342, a gate metal pattern 346, a drain metal pattern 344 and a plurality of conductive plugs 360. The source metal pattern 342 and the gate metal pattern 346 are formed on the epitaxial layer 320. The drain metal pattern 344 is deposited in the open 322 and is extended from the heavily doped substrate 310 upward over the epitaxial layer 320.

The conductive plugs 360 are arranged along two long edges 320a, 320c of the epitaxial layer 320 and one short edge 320b of the epitaxial layer 320 which is opposite to the open 322. The conductive plug 360 penetrates the epitaxial layer 320 to electrically connect the heavily doped substrate 310 below the epitaxial layer 320. The drain metal pattern 344 has an extension portion 344a laterally extended from the open 322 along the edge of the epitaxial layer 320 to connect these conductive plugs 360.

In the present embodiment, these conductive plugs 360 are metal plugs. However, the present invention is not limited thereto. In accordance with another embodiment of the present invention, these conductive plugs 360 may be manufactured by using a heavily doped semiconductor material.

Moreover, in the present embodiment, the conductive plug 360 is a circular-shaped column, and these conductive plugs 360 are evenly arranged in the epitaxial layer 320.

However, the present invention is not limited thereto. According to the practical need, the arrangement of these conductive plugs 360, such as the spacing therebetween, can be adjusted according to the current distribution in the heavily doped substrate 310 to reduce the overall resistance.

The spacing layer 350 is formed on the epitaxial layer 320 and fills the gaps among the source metal pattern 342, the gate metal pattern 346, and the drain metal pattern 344 to isolate the source electrode S, the gate electrode G, and the drain electrode D of the MOS device 300. The spacing layer 350 also has opens to define the contact areas of the source electrode, the gate electrode, and the drain electrode. In the present embodiment, the spacing layer 350 substantially fills the gaps among the source metal pattern 342, the gate metal pattern 346, and the drain metal pattern 344 but leaves the extension portion 344a of the drain metal pattern 344 exposed to expose the area corresponding to the drain contact pad.

FIGS. 5A to 5E are cross-sectional views showing a manufacturing method of the MOS device of FIGS. 4A and 4B in accordance with an embodiment of the present invention.

Figure 5A:
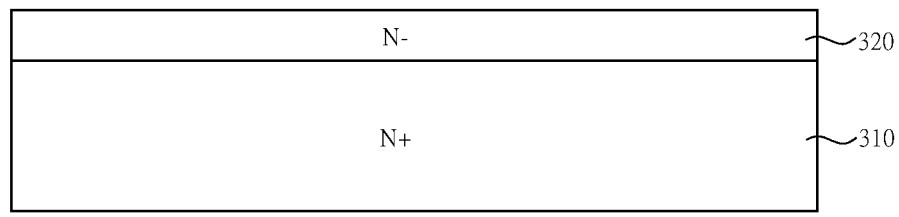
FIGS. 5A to 5E are schematic views showing a manufacturing method of the MOS device of FIGS. 4A and 4B in accordance with an embodiment of the present invention.

Firstly, as shown in FIG. 5A, a heavily doped substrate 310 is provided and an epitaxial layer 320 is formed on the heavily doped substrate 310.

Figure 5B:
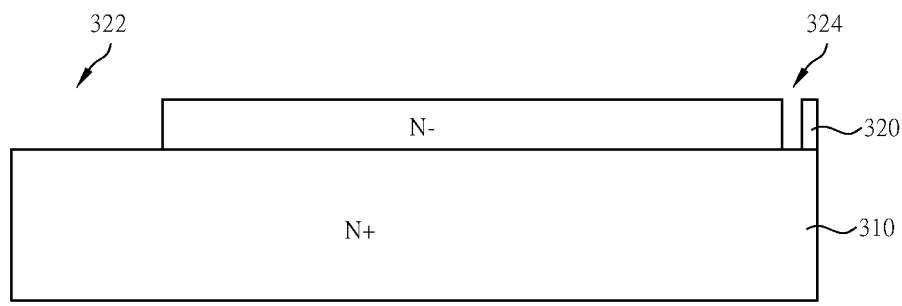

Afterward, as shown in FIG. 5B, a deep etching process is applied to the epitaxial layer 320 to form an open 322 in the epitaxial layer 320 to expose the heavily doped substrate 310 below the open 322. This deep etching process also forms a plurality of circular through holes 324 penetrating the epitaxial layer 320. In the present embodiment, please also referring to FIG. 4A, the open 322 is located at the corner of the epitaxial layer 320. These circular through holes 324 are arranged in the epitaxial layer 320 along two long edges 320a, 320c and a short edge 320h which is opposite to the open 322 of the epitaxial layer 320. Then, a plurality of MOS units (not shown) is formed in the epitaxial layer 320.

Figure 5C:
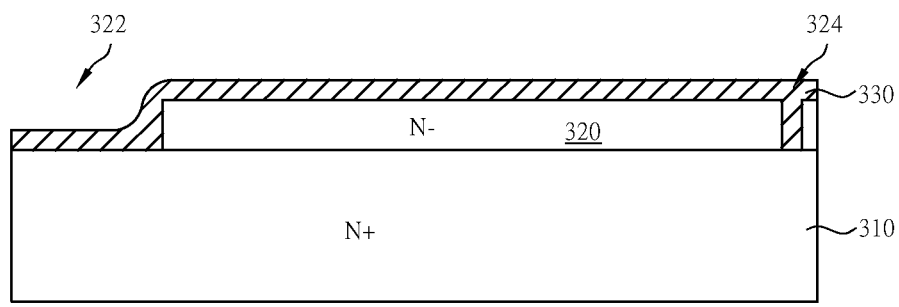

Afterward, as shown in FIG. 5C, a metal layer 330 is formed to cover the epitaxial layer 320 and the exposed area of the heavily doped substrate 310. The metal layer 330 is deposited in the open 322 of the epitaxial layer 320 and is extended from the upper surface of the heavily doped substrate 310 upward to cover the epitaxial layer 320. In addition, the metal layer 330 also fills the circular through holes 324 to form the conductive plugs 360.

Figure 5D:
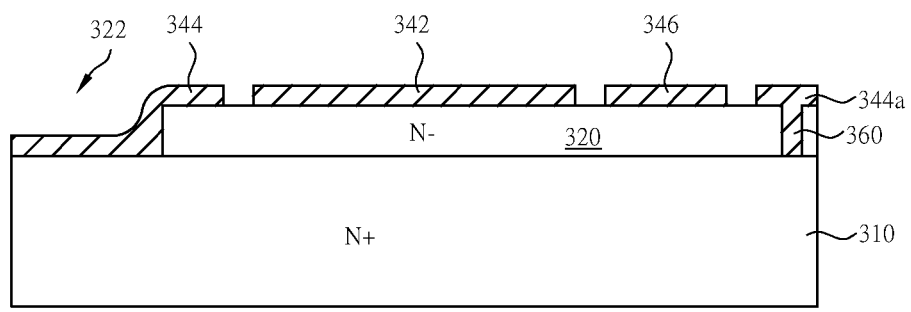

Thereafter, as shown in FIG. 5D, a lithographic and etching process is applied to the metal layer 330 to form a metal pattern layer, which includes a source metal pattern 342, a gate metal pattern 346, a drain metal pattern 344, and a plurality of conductive plugs 360. The source metal pattern 342 and the gate metal pattern 346 are located on the epitaxial layer 320. The drain metal pattern 344 is deposited in the open 322 of the epitaxial layer 320 and is extended from the heavily doped substrate 310 upward over the epitaxial layer 320. The drain metal pattern 344 also has an extension portion 344a which is extended along the edges of the epitaxial layer 320 to connect these conductive plugs 360.

Figure 5E:
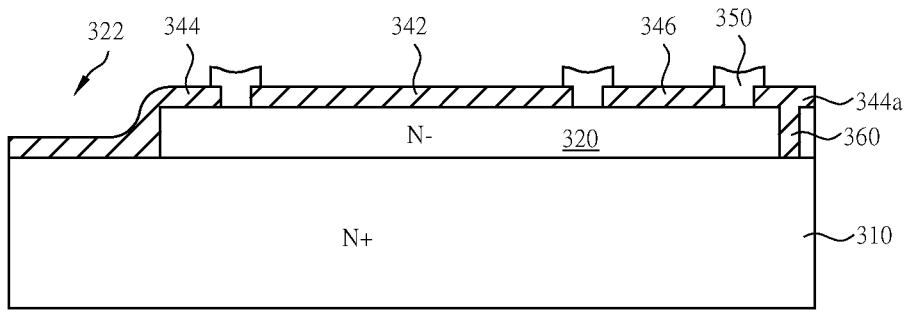

Afterward, as shown in FIG. 5E, a spacing layer 350 is formed on the epitaxial layer 320. The spacing layer 350 fills the gaps among the source metal pattern 342, the gate metal pattern 346, and the drain metal pattern 344, and has opens to define the positions of the source contact pad, the drain contact pad, and the gate contact pad.

By using the aforementioned manufacturing method, the MOS device 300 as shown in FIGS. 4A and 4B is formed.

In the aforementioned embodiment, the open 322 and the circular through holes 324 are formed in the epitaxial layer 320 before the step of forming the MOS units in the epitaxial layer 320. However, the present invention is not limited thereto. In accordance with another embodiment of the present invention, the open 322 and the circular through holes 324 may be formed in the epitaxial layer 320 after the step of the forming the MOS units in the epitaxial layer 320 and before the step of forming the metal layer 330. In addition, in the aforementioned embodiment, the open 322 and the circular through holes 324 are simultaneously formed in the epitaxial layer 320 by the same deep etching process. However, the present invention is not limited thereto. In accordance with another embodiment of the present invention, the open 322 and the circular through hole 324 may be formed in the epitaxial layer 320 in different etching steps. Moreover, in the aforementioned embodiment, the conductive plugs 360 are filled into the circular through holes 324 in the step of forming the metal layer 330. However, the present invention is not limited thereto. In accordance with another embodiment of the present invention, these conductive plugs 360 may be filled into the circular through holes 324 by using another material deposition step before the step of forming the metal layer 330.

Figure 6A:
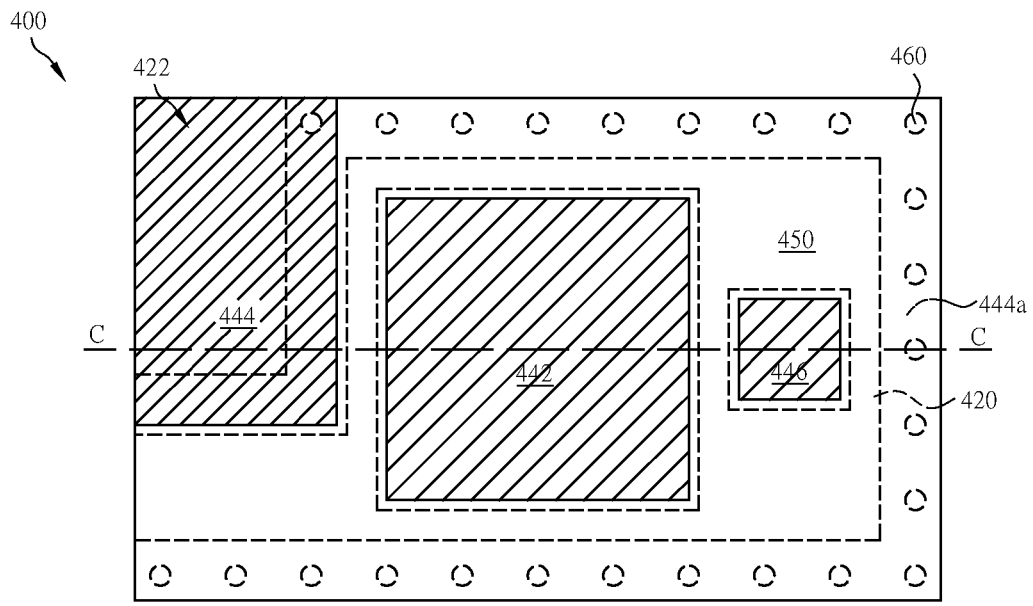
FIG. 6A is a top view of the MOS device in accordance with a fourth embodiment of the present invention.
Figure 6B:
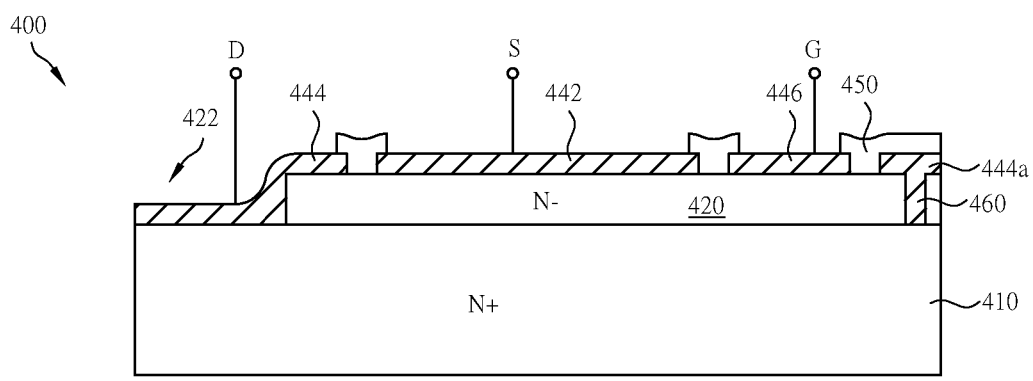
FIG. 6B is a cross-sectional view of the MOS device in FIG. 6A along line C-C.

FIG. 6A is a top view of the MOS device in accordance with a fourth embodiment of the present invention. FIG. 6B is a cross-sectional view of the MOS device in FIG. 6A along line C-C.

The arrangement of the conductive plugs 460, the source metal pattern 442, the gate metal pattern 446, and the drain metal pattern 444 of the MOS device 400 are identical to the embodiment of FIGS. 4A and 4B, and thus is not repeated here. However, in correspondence to the contact arrangement on the circuit board, the spacing layer 450 not only fills the gaps among the source metal pattern 442, the gate metal pattern 446, and the drain metal pattern 444, but also covers the extension portion 444a of the drain metal pattern 444 to show a rectangular shaped open at the corner to define the position of the drain contact pad. In an embodiment of the present invention, the position and the size of the rectangular shaped open is corresponding to the open 422 in the epitaxial layer 420 for exposing the heavily doped substrate 410.

Figure 7:
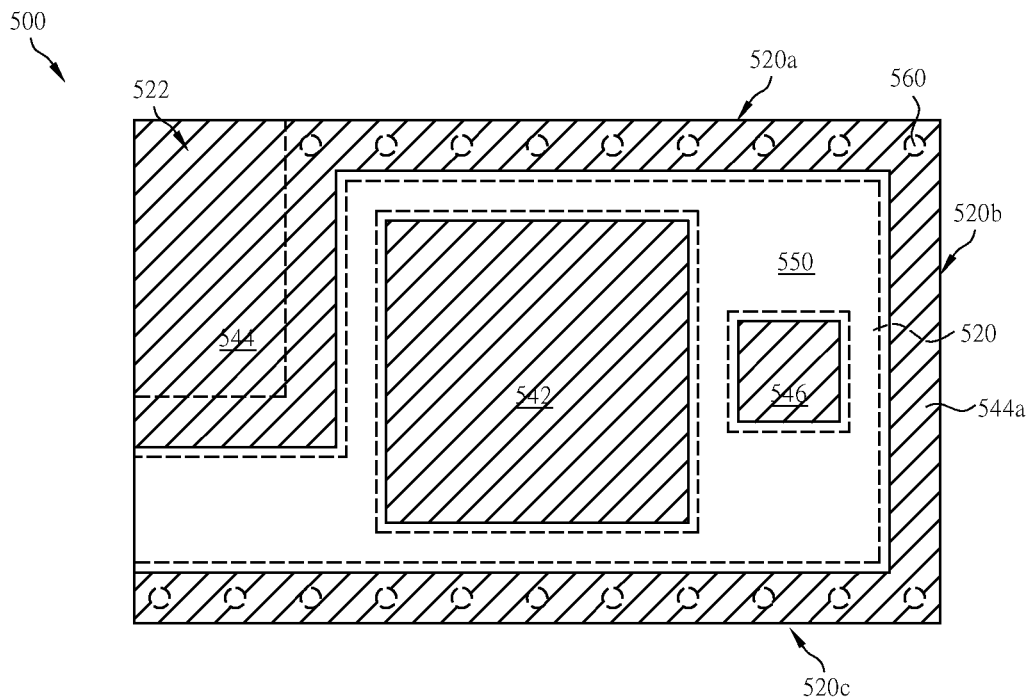
FIG. 7 is a top view of the MOS device in accordance with a fifth embodiment of the present invention.

FIG. 7 is a top view of the MOS device in accordance with a fifth embodiment of the present invention. A major difference between the present embodiment and the embodiment shown in FIG. 4A is that, these conductive plugs 560 of the MOS device 500 in the present embodiment are arranged along the two opposite long edges 520a and 520c of the epitaxial layer 520. In addition, the drain metal pattern 544 has an extension portion 544a laterally extended from the open 522 of the epitaxial layer 520 along the edges 520a, 520h, 520c of the epitaxial layer 520 to connect these conductive plugs 560.

The other features of the present embodiment, such as the open 522 in the epitaxial layer 520, the source metal pattern 542. The gate metal pattern 546, and the spacing layer 550 are similar to the embodiment in FIG. 4A and thus are not repeated here.

Figure 8:
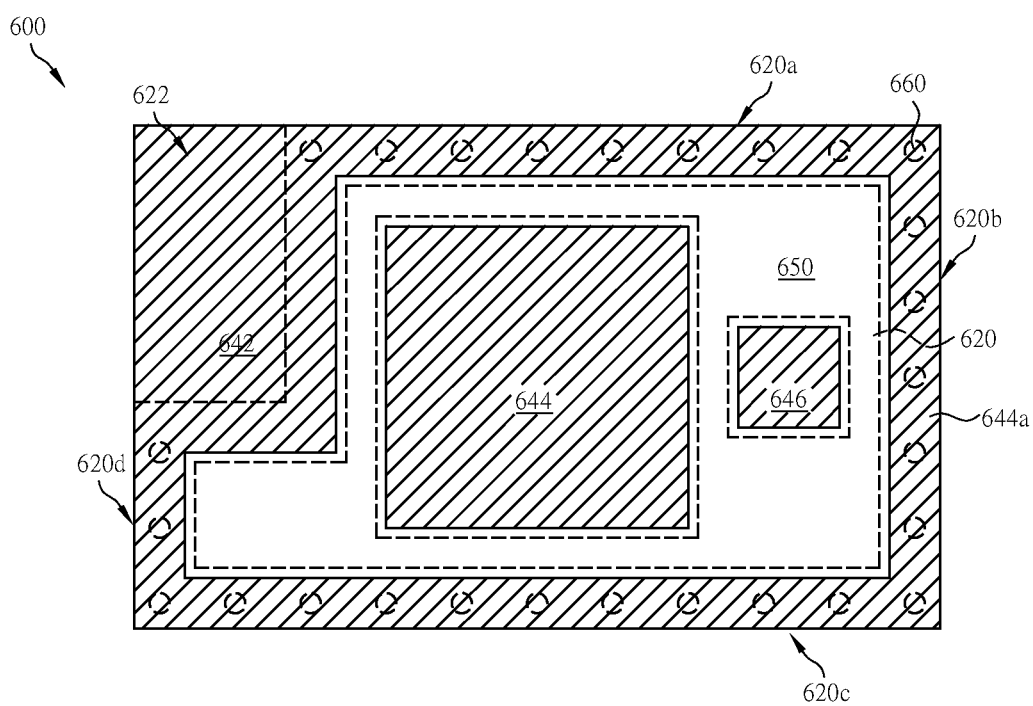
FIG. 8 is a top view of the MOS device in accordance with a sixth embodiment of the present invention.

FIG. 8 is a top view of the MOS device in accordance with a sixth embodiment of the present invention. A major difference between the present embodiment and the embodiment shown in FIG. 4A is that, the conductive plugs 660 of the MOS device 600 in the present embodiment are arranged to surround the four edges of the epitaxial layer 620. That is, these conductive plugs 660 are arranged in the epitaxial layer 620 along the two long edges 620a, 620c and the two short edges 620b, 620d. In addition, the drain metal pattern 644 has an extension portion 644a surrounding the four edges of the epitaxial layer 620 to connect these conductive plugs 660.

The other features of the present embodiment, such as the open 622 in the epitaxial layer 620, the source metal pattern 642, the gate metal pattern 646, and the spacing layer 650 are similar to the embodiment in FIG. 4A and thus are not repeated here.

Figure 9:
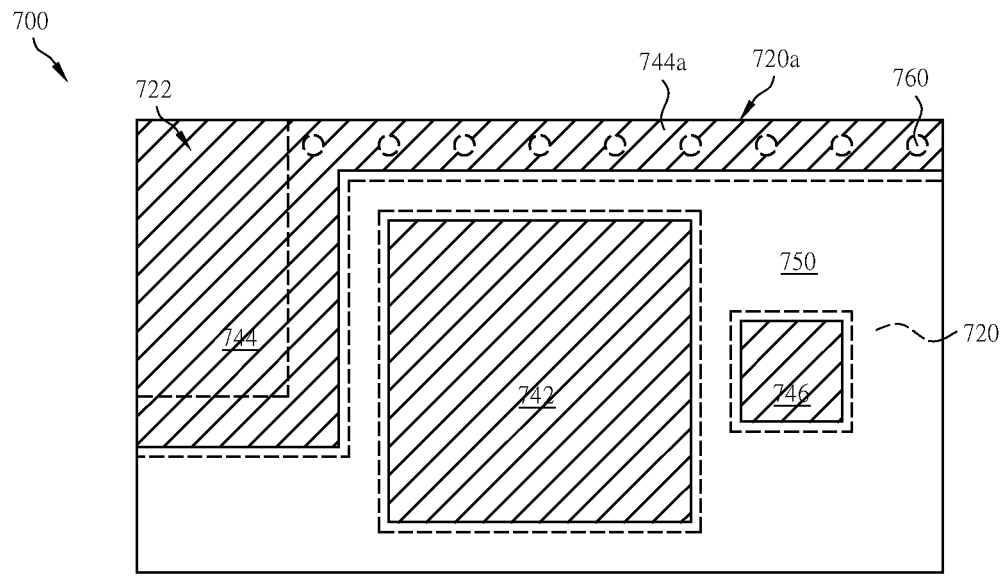
FIG. 9 is a top view of the MOS device in accordance with a seventh embodiment of the present invention.

FIG. 9 is top view of the MOS device in accordance with a seventh embodiment of the present invention. A major difference between the present embodiment and the embodiment shown in FIG. 4A is that, the conductive plugs 760 of the MOS device 700 in the present embodiment are arranged along a long edge 720a of the epitaxial layer 720. The drain metal pattern 744 has an extension portion 744a laterally extended along the long edge 720a to connect these conductive plugs 760.

Figure 10:
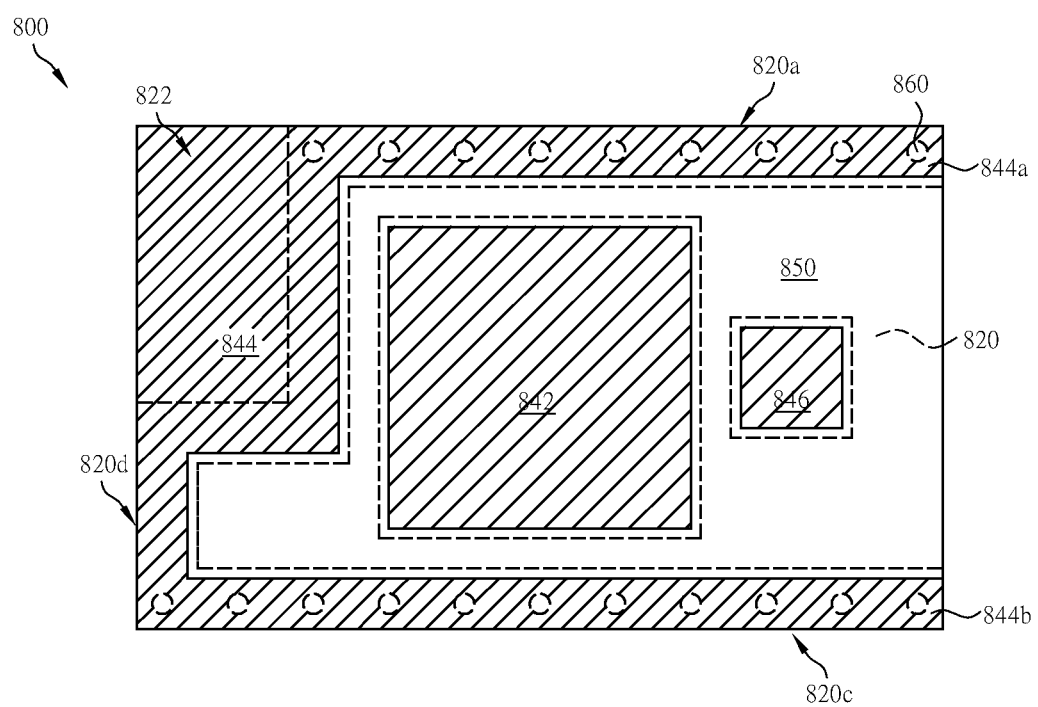
FIG. 10 is a top view of the MOS device in accordance with an eighth embodiment of the present invention.
Figure 11:
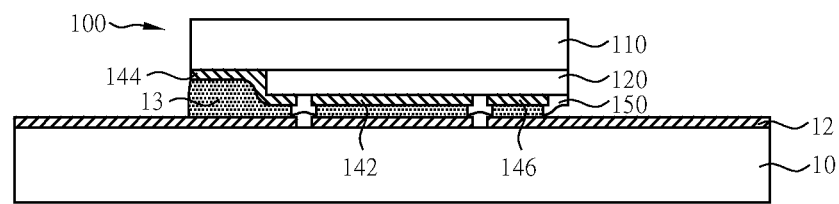
FIG. 11 is a schematic view showing the MOS device in FIG. 1B being mounted on a circuit board by using chip-scale packaging in accordance with an embodiment of the present invention.

The other features of the present embodiment, such as the open 722 in the epitaxial layer 720, the source metal pattern 742, the gate metal pattern 746, and the spacing layer 750 are similar to the embodiment in FIG. 4A and thus are not repeated here, FIG. 10 is a top view of the MOS device in accordance with an eighth embodiment of the present invention. A major difference between the present embodiment and the embodiment shown in FIG. 7 is that, the drain metal pattern 844 of the MOS device 800 in the present embodiment has two extension portions 844a and 844h. The extension portion 844a is extended along the long edge 820a to connect the conductive plugs 860, and the extension portion 844h is extended along the short edge 820d and the long edge 820c to connect the conductive plugs 860. The other features of the present embodiment, such as the open 822 in the epitaxial layer 820, the source metal pattern 842, the gate metal pattern 846, and the spacing layer 850 are similar to the embodiment in FIG. 7 and thus are not repeated here FIG. 11 is a schematic view showing the MOS device 100 of FIG. 1B mounted on a circuit board 10 by using chip-scale packaging in accordance with an embodiment of the present invention. As shown, the MOS device 100 is flipped and placed on the circuit board 10.

In the present embodiment, the MOS device 100 is mounted on the circuit board 10 by using a solder material 13 to have the source metal pattern 142, the gate metal pattern 146, and the drain metal pattern 144 fixed on the circuit board 10 and have the source metal pattern 142, the gate metal pattern 146, and the drain metal pattern 144 electrically connected to the circuitry 12 on the circuit board 10. However, the present invention is not limited thereto. In accordance with another embodiment of the present invention, the MOS device 100 can also be mounted on the circuit board 10 by using a conductive paste to have the source metal pattern 142, the gate metal pattern 146, and the drain metal pattern 144 bonded on and electrically connected to the circuit board 10.

In comparison to the conventional MOS device, the MOS device provided in the present invention is suitable to be applied to chip-scale packaging and thus is helpful for reducing packaging size as well as packaging cost.

While the present invention has been particularly shown and described with reference to a preferred embodiment, it will be understood by those skilled in the art that various changes in form and detail may be without departing from the spirit and scope of the present invention.

What is claimed is:

1. A MOS device, comprising:
a heavily doped substrate;
an epitaxial layer, formed on the heavily doped substrate;
an open, defined in the epitaxial layer to expose the heavily doped substrate;
a plurality of MOS units, formed in the epitaxial layer; and
a metal pattern layer, comprising:
a source metal pattern, formed on the epitaxial layer;
a gate metal pattern, formed on the epitaxial layer; and
a drain metal pattern, deposited in the open and extended from the heavily doped substrate upward over the epitaxial layer,
wherein the open is located at a corner of the epitaxial layer.

2. The MOS device of claim 1, wherein the open is defined in the epitaxial layer by at least two etching walls.

3. The MOS device of claim 1, further comprising a plurality of conductive plugs, arranged along at least one edge of the epitaxial layer and penetrating the epitaxial layer, wherein the drain metal pattern is extended to connect the conductive plugs.

4. The MOS device of claim 3, wherein the conductive plug is a circular-shaped column.

5. The MOS device of claim 3, wherein the conductive plug is a metal plug.

6. The MOS device of claim 3, wherein the conductive plugs are arranged along two opposite edges of the epitaxial layer.

7. The MOS device of claim 3, wherein the conductive plugs are evenly arranged along the at least one edge of the epitaxial layer.

8. The MOS device of claim 3, wherein the epitaxial layer has a rectangular-shaped upper surface, and the conductive plugs are arranged along a long edge of the epitaxial layer.

9. The MOS device of claim 1, wherein the MOS units are trenched MOS units.

* * * * *